United States Patent
Cochet et al.

(10) Patent No.: US 8,592,003 B2
(45) Date of Patent: Nov. 26, 2013

(54) HIGHLY TRANSPARENT ELECTROCHROMIC COATING MATERIAL, METHOD FOR PRODUCING THE SAME AND USE OF THE MATERIAL

(75) Inventors: Ayse Cochet, Wurzburg (DE); Uwe Posset, Cadolzburg (DE); Gerhard Schottner, Heilsbronn (DE); Giorgio Pagani, Milan (IT); Ricardo Ruffo, Milan (IT); Luca Beverina, Milan (IT); Claudio Maria Mari, Milan (IT); Giorgio Patriarca, Buccinasco (IT); Alessandro Abbotto, Milan (IT)

(73) Assignees: Fraunhofer-Gesellschaft zur forderung der angewandten Forschung e.V., München (DE); Universita Degli Studi di Milano-Bicocca, Milan (IT)

( * ) Notice: Subject to any disclaimer, the term of this patent is extended or adjusted under 35 U.S.C. 154(b) by 1037 days.

(21) Appl. No.: 12/517,027

(22) PCT Filed: Nov. 28, 2007

(86) PCT No.: PCT/EP2007/010323
§ 371 (c)(1),
(2), (4) Date: Nov. 24, 2009

(87) PCT Pub. No.: WO2008/064878
PCT Pub. Date: Jun. 5, 2008

(65) Prior Publication Data
US 2010/0189918 A1 Jul. 29, 2010

(30) Foreign Application Priority Data
Dec. 1, 2006 (EP) .................... 06024930

(51) Int. Cl.
- B05D 5/12 (2006.01)
- B05D 3/06 (2006.01)
- H01B 3/06 (2006.01)

(52) U.S. Cl.
USPC ............. 427/535; 427/558; 427/559; 427/58; 252/500; 252/519.33

(58) Field of Classification Search
None
See application file for complete search history.

(56) References Cited

U.S. PATENT DOCUMENTS 3,698,908 A * 10/1972 Macdonald et al. .......... 430/517
5,111,327 A *  5/1992 Blohm et al. ................. 526/256

(Continued)

FOREIGN PATENT DOCUMENTS

DE  101 62 746 A1  7/2003
EP  1 321 483 A1  6/2003

(Continued)

OTHER PUBLICATIONS

Lowe et al., Synthesis and Photlithography of Polymers and Coplymers based on Poly(3-(2-methacryloyloxy)ethyl)thiophene), Apr. 1995, Marcomolecules 1995, vol. 28, 4608-4616.*

(Continued)

*Primary Examiner* — Randy Gulakowski
*Assistant Examiner* — Jeffrey Washville
(74) *Attorney, Agent, or Firm* — Leydig, Voit & Mayer, Ltd.

(57) ABSTRACT

The present invention relates to a method for the preparation of a novel hybrid electrochromic coating material with superior performance in terms of transparency, electrochromic contrast, coloration efficiency, and adhesion, for a use in electrochromic devices for applications where a high transparency is required in the bleached state.

Figure 1:
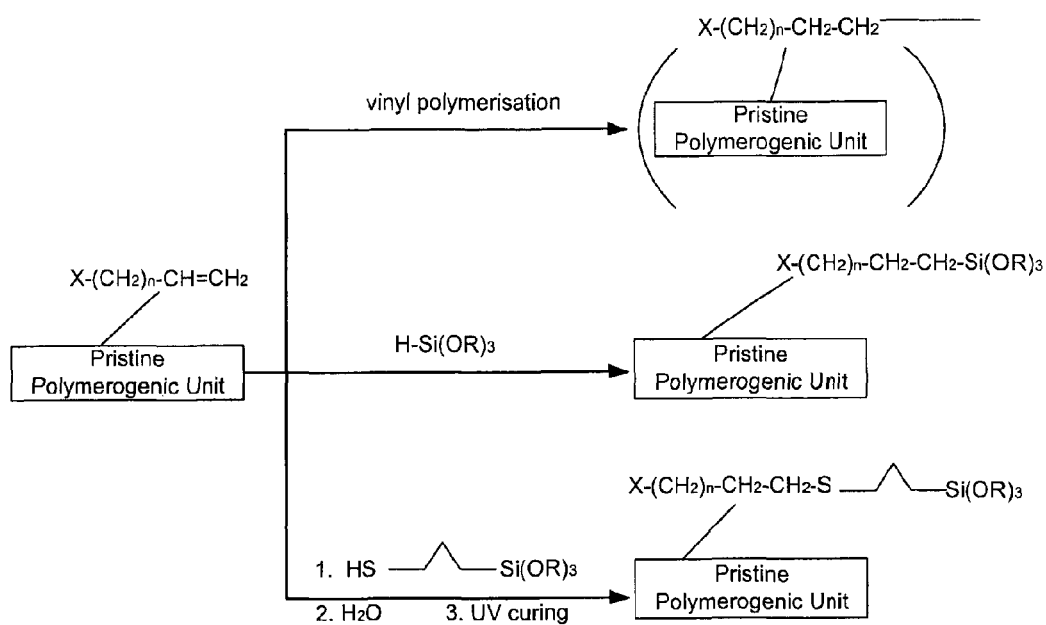
Figure 1:
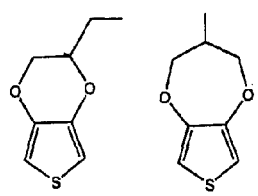

53 Claims, 4 Drawing Sheets wherein the Pristine Polymerogenic Unit is represented by a mixture of m %  (100-m) %

(56) References Cited

U.S. PATENT DOCUMENTS

| | | | |
|---|---|---|---|
| 6,747,780 B2 | 6/2004 | Xu et al. | |
| 2004/0085711 A1* | 5/2004 | Merker et al. | 361/523 |
| 2004/0096695 A1* | 5/2004 | Willaert et al. | 428/690 |
| 2004/0227128 A1 | 11/2004 | Reuter et al. | |
| 2005/0009986 A1* | 1/2005 | Groenendaal et al. | 524/811 |
| 2005/0129857 A1 | 6/2005 | Pollack et al. | |

FOREIGN PATENT DOCUMENTS

| | | |
|---|---|---|
| EP | 1 391 474 A1 | 2/2004 |
| EP | 1 440 974 A2 | 7/2004 |
| WO | WO 02/079316 A2 | 10/2002 |
| WO | WO 03/046106 A1 | 6/2003 |

OTHER PUBLICATIONS

Aasmundtveit et al., "Structure of thin films of poly(3,4-ethylenedioxythiophene)," Synthetic Metals, vol. 101, pp. 561-564 (1999).

Akoudad et al., "Modification of the electrochemical and electronic properties of electrogenerated poly(3,4-ethylenedioxythiophene) by hydroxymethyl and oligo(oxyethylene) substituents," Electrochemistry Communications, vol. 2, pp. 72-76 (2000).

Argun et al., "Electrochromic Polymers for Patterned Devices," Polymer Preprints, vol. 45, No. 1, p. 169 (2004).

Argun et al., "Multi-Color Electrochromic Polymers on Reflective Devices," Polymeric Materials: Science & Engineering, vol. 90, p. 40 (2004).

Aubert et al., "Microporous Patterned Electrodes for Color-Matched Electrochromic Polymer Displays," Chemical Materials, vol. 16, No. 12, pp. 2386-2393 (2004).

Ha et al., "Towards a Transparent, Highly Conductive Poly(3,4-ethylenedioxythiophene)," Advanced Functional Materials, vol. 14, No. 6, pp. 615-622 (2004).

Heuer et al., "Electrochromic Window Based on Conducting Poly(3,4-ethylenedioxythiophene)-Poly(styrene sulfonate)," Advanced Functional Materials, vol. 12, No. 2, pp. 89-94 (2002).

Imae et al., "Synthesis of a Novel Family of Electrochemically-Doped Vinyl Polymers Containing Pendant Oligothiophenes and Their Electrical and Electrochromic Properties," Macromolecules, vol. 30, pp. 380-386 (1997).

Kim et al., "Electronic, chemical and structural change induced by organic solvents in tosylate-doped poly(3,4-ethylenedioxythiophene) (PEDOTS-OTs)," Synthetic Metals, vol. 149, pp. 169-174 (2005).

Kumar et al., "Chemically Polymerized Alkyl Derivatized Poly (ethylenedioxythiophene's) as Soluble conjugated Polymers," Polymer Preprints, vol. 37, No. 2, p. 337 (1996).

Kumar et al., "Conducting Poly(3,4-alkylenedioxythiophene) Derivatives as Fast Electrochromics with High-Contrast Ratios," Chemical Materials, vol. 10, pp. 896-902 (1998).

Pagani et al. "Poly(2,2'-Spaced-Dipyrroles): Bandgap Contraction by Additive and Charge-Transfer Mechanisms," Advanced Materials, vol. 8, No. 10, pp. 819-823 (1996).

Reynolds et al., "Electrochromic Polymers and Devices via Electropolymerized Low Potential Monomers," Polymer Preprints, vol. 37, No. 1, p. 135 (1996).

Rosseinsky et al., "Electrochromic Systems and the Prospects for Devices," Advance Materials, vol. 13, No. 11, pp. 783-793 (2001).

Sadki et al., "The mechanism of pyrrole electropolymerization," Chem. Soc. Rev., vol. 29, pp. 283-293 (2000).

Schwendeman et al., "Combined Visible and Infrared Electrochromism Using Dual Polymer Devices," Advanced Materials, vol. 13, No. 9, pp. 634-637 (2001).

Schwendeman et al., "Electrochromic Devices as Platforms for Studying Visible and IR Characteristics in Conducting Polymers," Polymeric Materials: Science & Engineering, vol. 86, pp. 556-556 (2002).

Thompson et al., "In Situ Colorimetric Analysis of Electrochromic Polymers and Devices," Chemical Materials, vol. 12, pp. 1563-1571 (2000).

Welsh et al., "Easily Functionalized 3,4-Ethylenedioxythiophene," Polymer Preprints, vol. 38, No. 2, p. 320 (1997).

Welsh et al., "Enhanced Contrast Ratios and Rapid Switching in Electrochromics Based on Poly(3,4-propylenedioxythiophene) Derivatives," Advanced Materials, vol. 11, No. 16, pp. 1379-1382 (1999).

Welsh et al., "Fast Electrochromic Polymers Based on New Poly(3,4-alkylenedioxythiophene) Derivatives," Synthetic Metals, vol. 102, pp. 967-968 (1999).

Welsh et al., "High Contrast Electochromic Materials Based on Poly(3,4-Propylenedioxythiophene) Derivatives," Polymer Preprints, vol. 40, No. 2, p. 1206 (1999).

Xu et al., "Enhanced Contrast Ratios and Rapid Switching Color Changeable Devices Based on Poly(3,4-propylenedioxythiophene) Derivatives and Counterelectrode," Smart Structures and Materials 2002: Electroactive Polymer Actuators and Devices, Proceedings of SPIE, vol. 4695, pp. 442-450 (2002).

Xu et al., "Enhanced smart window based on electrochromic (EC) polymers," Smart Structures and Materials 2003: Electroactive Polymer Actuators and Devices, Proceedings of SPIE, vol. 5051, pp. 404-411 (2003).

* cited by examiner wherein the Pristine Polymerogenic Unit is represented by a mixture of m %        (100-m) %

HIGHLY TRANSPARENT ELECTROCHROMIC COATING MATERIAL, METHOD FOR PRODUCING THE SAME AND USE OF THE MATERIAL

CROSS-REFERENCE TO RELATED APPLICATIONS

This patent application is a national stage application of international patent application PCT/EP2007/010323, filed Nov. 28, 2007, which claims the benefit of EP 06024930.7, filed Dec. 1, 2006, which is incorporated by reference.

The invention relates to a method for the preparation of a novel hybrid electrochromic coating material with superior performance in terms of transparency, electrochromic contrast, colouration efficiency, and adhesion, for a use in electrochromic devices for applications where a high transparency is required in the bleached state.

BACKGROUND OF THE INVENTION

Since the discovery of inherently conductive polymers (ICP), there is huge interest in their use for a variety of applications. Thin films of ICP gain electrical conductivity by oxidation (p-doping) or reduction (n-doping) usually accompanied by the insertion of anionic or cationic species to assure charge neutrality. The charge carriers formed are able to move along the n-conjugated carbon double bonds of the polymer backbone, which imparts to the polymeric material an intrinsic electronic conductivity (S. Sadki, P. Schottland, N. Brodie, G. Sabouraud, Chem. Spc. Rev. 2000, 29, 283).

All ICP are potentially electrochromic, i.e., able to change their absorption characteristics depending on their redox state. One possible field of application for ICP are therefore electrochromic devices (ECD), i.e. smart, switchable devices that are able to undergo electrochemically reversible colour changes and allow a deliberate power-triggered reduction of light transmittance whenever needed. ECDs usually consist of two complementary electrochromic materials, contacted by metallic or oxidic conductors with an electrolyte inbetween (D. R. Rosseinski, R. J. Mortimer, Adv. Mater. 2001, 13, 783). Since one of the electrochromic materials is anodically colouring while the other changes its colour cathodically, they behave together as a redox pair, and, after application of a potential, high contrasts may be achieved. There have been many efforts in the past to utilise ECDs for eye protection and light transmittance control systems. However, though some ECDs based upon inorganic oxides or organic dyes show good performance, there are still major disadvantages obstructive to a broader exploitation. In particular, a technology is lacking to produce cost-effective, battery-driven plastic ECDs with an uncoloured, highly transmittive bleached state and a strong electrochromic contrast.

Poly(3,4-ethylene dioxythiophene) (PEDOT), a well known n-conjugated conductive polymer, shows a fairly high transparency in its oxidised state, and compared to other conductive polymers, it is more environmentally stable. Due to its remarkable properties, it has been suggested for a couple of applications, among them being electrochromic devices as well (H. W. Heuer, R. Wehrmann, S. Kirchmeyer, Adv. Funct. Mater. 2002, 12, 89). However, regardless of the type of preparation (by electropolymerisation, chemical oxidative polymerisation, or from polymer dispersions), PEDOT films always show a sky-blue colour in their oxidised (bleached) state, which is not acceptable for applications where a "water-clear" appearance is needed. Studies performed to enhance the transparency of PEDOT films (Y.-H. Ha, N. Nikolov, S. K. Pollack, J. Mastrangelo, B. D. Martin, R. Shashidhar, Adv. Funct. Mater. 2004, 14, 615) were targeted to decrease the coating thickness rather than the absorption.

A versatile derivative of 3,4-ethylene dioxythiophene (EDOT) is "EDOT-MeOH" (also called Baytron M-OH), a hydroxyfunctional derivative of the parent EDOT monomer. In-situ polymerised films derived from EDOT-MeOH have been suggested for a use in capacitors (U. Merker, K. Reuter, K. Lerch (Bayer Chemical Corp.), US 2004/0085711 A1, 2004). Though these films show optical properties very similar to PEDOT films, the monomer is capable of being functionalised and shows enhanced solubility in water.

The band gap (i.e. the electro-optical properties) and conductivity of conducting polymers can be controlled by proper choice of substituents, (G. Pagani. A. Berlin, A. Canavesi, G. Schiavon, S. Zecchin, G. Zotti, Adv. Mater 8 (1996) 819, and references therein), thus opening ways to more transmittive systems. Moreover, with regard to electrochromic devices, a method is required to ensure durable adhesion of the organic polymer films on the contacting transparent electrodes that are preferably of inorganic nature. The present invention picks up on these points.

A large number of publications are available dealing with several aspects of poly(alkylene dioxythiophene) based materials. Only some selected articles or patents shall be mentioned here.

The chemical oxidative polymerisation of substituted poly (alkylene dioxythiophene)s to thin films for a use in electrolyte capacitors was described in US 2004/0085711 A1/EP 1 391 474 (Bayer Corp.). The polymers claimed comprised alkyl, aralkyl, aryl or cycloalkyl end groups.

US 2005/0129857 A1 describes a chemical polymerisation procedure for highly conducting and transparent EDOT films using imidazole as the moderator base. Thereby, the transparency depended on the coating thickness.

The chemical oxidative polymerisation of EDOT and the properties of the resulting polymer was described in Synth. Met. 101, 1999, 561-564 and Synth. Met. 149, 2005, 169-174.

The synthesis by chemical polymerisation using ferric chloride in dry chloroform of a series of soluble alkyl derivatised poly(alkylene dioxythiophene)s were described in Polymer Preprints (American Chemical Society, Division of Polymer Chemistry) 37(2), 1996, 337.

A preparation route for hydroxymethyl substituted EDOT and electrochemical polymerisation thereof was described by Welsh, Dean M. et al. in Polymer Preprints (American Chemical Society, Division of Polymer Chemistry) (1997), 38(2), 320.

The synthesis of EDOT derivatives with hydroxymethyl or methoxyethoxyethoxymethyl groups as well as the effect of substituents on the band-gap level was described in Electrochemistry Communications (2000), 2(1), 72-76.

In Polymer Mater. Sci. Eng. (2002), 86, 55-56, the electrochromism of poly(bis(3'-methyl)-3,4-propylene dioxythiophene) (PProDOT-Me2), poly(3,4-ethylene dioxythiophene) (PEDOT), poly-(3,6-bis(3,4-ethylene dioxythienyl)-N-methylcarbazole) (PBEDOT-NMeCz), poly (3,4-ethylene dioxypyrrole) (PEDOP), poly(3,4-propylene dioxypyrrole) (PPropOP), and their N-substituted analogues were investigated with regard to a use in ECDs.

In Polymer Preprints (American Chemical Society, Division of Polymer Chemistry) (1999), 40(2), 1206, the synthesis and electropolymerisation of substituted 3,4-propylene dioxythiophene (ProDOT) derivatives were reported.

A synthesis route for dimethylated poly(3,4-propylene dioxythiophene) (PProDOT) for electrochromic devices was described in Advanced Materials (Weinheim, Germany) (1999), 11(16), 1379-1382. Electrochromic devices based on poly(3,4-propylene dioxythiophene) derivatives were proposed in Proceedings of SPIE—The International Society for Optical Engineering (2002), 4695 (Electroactive Polymer Actuators and Devices (EAPAD)), 442-450.

An article in Synthetic Metals (1999), 102(1-3), 967-968 deals with the electrochemical synthesis of a series of poly (3,4-alkylene dioxythiophene)s using 3,4-alkylene dioxythiophene derived monomers where either the size of the alkylene dioxy ring or the nature of the pendant group was varied.

In Chemistry of Materials (1998), 10(3), 896-902, the electrochemical synthesis of Poly(3,4-alkylene dioxythiophene) derivatives from (3,4-ethylene dioxythiophene (EDOT), 2-methyl-2,3-dihydrothieno[3,4-b][1,4]-dioxine (EDOT-Me), 2-tetradecyl-2,3-dihydrothieno-[3,4-b][1,4]dioxine (EDOT-C14H29), 2-phenyl-2,3-dihydrothieno[3,4-b][1,4] dioxine (EDOT-Ph), 3,4-dihydro-2H-thieno[3,4-b][1,4]dioxepine (ProDOT), 3-methyl-3,4-dihydro-2H-thieno[3,4-b][1,4]dioxepine (ProDOT-Me), 2,3,4,5-tetrahydrothieno[3,4-b][1,4]-dioxocine (BuDOT), and 5,10-dihydrobenzo[f]thieno-[3,4-b][1,4]dioxocine (BuDOT-Xyl)) was described. The materials were claimed to be fast electrochromics with high contrast ratios.

Electrochemically prepared electrochromic polymers including alkyl derivatives of poly(3,4-ethylene dioxythiophene) and derivatives of bis(3,4-ethylene dioxy) arylenes are briefly discussed in Polymer Preprints (American Chemical Society, Division of Polymer Chemistry) (1996), 37(1), 135.

DE 101 62 746 deals with a process for the production of 5-alkyl dioxeno[2,3-c]thiophenes via transetherificative cyclocondensation of 3,4-dialkoxythiophenes with vicinal alkanediols.

The manufacture of alkylene dioxythiophene dimers and trimers as precursors for conductive polymers was described in EP 1 375 560.

U.S. Pat. No. 6,747,780 (2002) comprises electrochromic organic polymer syntheses and devices (e.g. surface plasmon resonance imaging systems, electrochromic windows, and ECD) utilizing electrochromic organic polymers. Laminated electrochromic devices with a cathodic polymer (e.g., poly [3,3-dimethyl-3,4-dihydro-2H-thieno[3,4-b][1,4]dioxepine]) layer; a solid electrolyte layer; and a counter electrode layer are described. An anodic polymer layer (e.g., poly(3,6-bis(2-(3,4-ethylenedioxythiophene))-N-methylcarbazole)) may be formed on the electrolyte layer under the counter electrode.

In PCT Int. Appl. (2003), 150 pp. (WO 03046106), electrochromic polymers including substituted poly(3,4-ethylene dioxythiophene) are described for a use in electrochromic device applications.

In Chemistry of Materials (2004), 16(12), 2386-2393, the authors report on the use of highly porous membranes which allow the production of patterned, rapid-switching, reflective ECDs. As the active EC materials, they used poly(3,4-ethylene dioxythiophene) (PEDOT), poly(3,4-propylene dioxythiophene) (PProDOT), and the dimethyl-substituted derived PProDOT-Me2.

Several methods to pattern conducting polymers to build ECDs and multi-colour displays, which are made possible through patterning of electrode surfaces, were published in Polymer Preprints (American Chemical Society, Division of Polymer Chemistry) (2004), 45(1), 169.

Exemplary for di-Me substituted poly(propylene dioxythiophene) (PProDOT-Me2) films, electrochemical and spray coating techniques to deposit electrochromic polymers onto porous metallised membranes which are used to construct reflective type polymer electrochromic devices were described in Polymeric Materials Science and Engineering (2004), 90, 40.

In patent application U.S. Pat. Appl. Publ. (2002), 29 pp. U.S. Pat. No. 6,747,780, laminated electrochromic devices are described which comprise a transparent electrode layer; a cathodic polymer (e.g., poly[3,3-dimethyl-3,4-dihydro-2H-thieno[3,4-b][1,4]dioxepine]) layer; an electrolyte layer comprising a solid electrolyte; and a counter electrode layer. An anodic polymer layer (e.g., poly(3,6-bis(2-(3,4-ethylene dioxythiophene))-N-methylcarbazole)) may be formed on the electrolyte layer under the counter electrode.

In Advanced Materials (Weinheim, Germany) (2001), 13(9), 634-637, the authors describe the optimisation of electrochromic devices that operate in the reflective mode and are able to modulate the reflectivity in the visible, near-IR and mid-IR regions of the electromagnetic spectrum. The used electrochromic material was PProDOT-Me2.

An ECD application using the electrochromic polymers poly[3,3-dimethyl-3,4-dihydro-2H-thieno(3,4-b)(1,4)dioxepine] (PProDOT-$(CH_3)_2$) and poly[3,4-(2,2-dimethylpropylene dioxy)-pyrrole] (PProDOP-$(CH_3)_2$) was described in: Proc. SPIE—The International Society for Optical Engineering (2003), 5051 (Electroactive Polymer Actuators and Devices (EAPAD)) 404-411.

WO 02/079316 describes the application of aqueous compositions containing 3,4-dialkoxy thiophene polymers and non-newtonian binders for electrochromic devices.

None of the described electrochromic polymers and devices apparently fulfils the requirements in terms of transparency in the bleached or oxidised state for applications where a highly transmittive state is required. Information about the durability and environmental stability of the polymer films or devices is given in only a few cases. Poor adhesion at the interfaces of polymer and inorganic oxide layers turned out to be a common reason for poor cycle stability (delamination upon electrochemical cycling).

It has been found that the polymeric materials claimed by other authors or inventors to have at least one colourless (or nearly colourless) state do not comply with transparency requirements for ophthalmic and automotive applications or articles. For instance, PEDOT (which is usually claimed to be colourless in its oxidised form) shows a light blue colour at coating thicknesses in the range of several hundred nanometres. Going to thinner films results in higher transparency, but lower electrochromic contrast, thus, is not supposed to be useful.

In cases where a real colourless state has been reported (B. C. Thompson, P. Schottland, K. Zong, J. R. Reynolds, Chem. Mater, 2000, 12, 1563), the authors operated with variable potentials in order to have intermediate oxidation states. This cannot be done with a battery providing a single definite voltage.

To work at fixed potentials is a considerable improvement in relation with the necessity of intermediate oxidation states and the need of tuning the potential.

A further drawback was identified in that polymeric thin films prepared by in-situ chemical polymerisation suffer from poor adhesion on transparent conducting oxides. This becomes particularly evident during the rinsing step being an essential part of the in-situ polymerisation procedure where delamination of the polymer films frequently and readily occurred.

The fact that electrochromic polymer films deposited on inorganic surfaces—presumably due to what is outlined in the previous section—easily delaminate upon continuous potential cycling in liquid or semi-liquid electrolytes was considered to be a further drawback. This phenomenon has been described several times in literature and was recently confirmed by own investigations.

Therefore, it is an object of the present invention to provide a method which allows the preparation of a highly transparent electrochromic coating material with improved adhesion performance, thus avoiding the problems known from the state of the art.

This object is achieved by the method given with the features of claim 1 and the coating material given with the features of claim 24. Possible uses of the coating are named in the claims 37 to 48. Herein, the depending claims describe preferred embodiments, respectively.

According to the invention, a method for preparation of a electrochromic coating material is provided by subsequently performing the following steps:

a) reaction of a solution comprising a mixture of a compound having the general formula I and a compound having the general formula II in a molar ratio of I:II which is equal to m:(100−m) wherein m has a value from 60 to 99

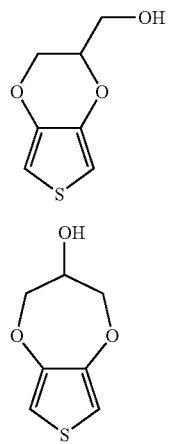

formula I formula II with a compound of the general formula III

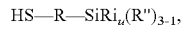

formula III wherein X is selected from the group consisting of Y—, Y—C(O)— or OCN—
in which Y is selected from the groups of halides, mesylates and/or triflates,
R is a linear and/or branched alkylene chain with 1 to 16 carbon atoms, and
A is a linear and/or branched alkyl chain with 1 to 16 carbon atoms or hydrogen
b) further reacting the mixture of compounds derived from step a) by either
b1) a vinyl copolymerisation
b2) a hydrosilylation of the vinyl moiety with a silane of the general formula $HSiR'_u(R'')_{3-u}$, wherein R' is selected from the group consisting of linear or branched alkyl or alkenyl chains with 1 to 12 carbon atoms in the main chain, wherein the chains can be substituted with acryloxy-, methacryloxy-, succinyl-, amino-, hydroxyl-, mercapto-, and/or glycidoxy groups and/or interrupted by O- and/or S-atoms and/or a NR-group,
R'' is selected from the group consisting of halogens, hydroxyl-groups, alkoxy-groups and/or acyl-groups with 1 to 4 carbon atoms, and
u=0, 1, 2, 3; and further
b3) a thiol-ene addition to the vinyl moiety with a compound of the general formula $$HS—R—SiR'_u(R'')_{3-u},$$

wherein R, R', R'' and u have the same meaning as indicated above;
c) in-situ chemical oxidative polymerisation of a solution of the compound and/or the compounds derived from step b).

For enhancement of the reactivity of the compound with formula III, the double bond is preferably, but not exclusively a terminal double bond. Generally speaking, in step b), a reaction with compounds that upon hydrolysis or polycondensation impart sol-gel-processability to the whole system is carried out.

It is preferred, if m has a value from 70 to 95.

In an improved embodiment, in step a) a base selected from the group of aromatic and/or aliphatic nitrogen containing compounds is used in a stoichiometric or sub-stoichiometric ratio. The scope of the aromatic nitrogen containing compounds is not limited, yet it is advantageous if the base is selected from the group consisting of pyridine, 4-(dimethylamino)-pyridine, triethylamine and/or mixtures thereof.

Preferably, in step a) a solvent, selected from the group consisting of acetonitrile, dichloromethane, toluene, 1,4-dioxane and mixtures thereof is used.

Furthermore, it is advantageous if in step a) the reaction mixture is heated to reflux condition of the according solvent.

The additional reaction step b) can be preferably carried out in situ, which simplifies the whole procedure of synthesis.

In a further preferred embodiment, in step b1) the mixture of compounds derived from step a) is copolymerized. This is to understood that the compounds derived from step a) (which now bear the reactive vinyl moiety) are polymerized by methods known to those skilled in the art. These methods include but are not exclusively limited to radical polymerisation. According to this embodiment, a copolymer is derived from step b1).

In an alternative preferred embodiment, before the copolymerisation of step b1) is undertaken further a alkenyl functionalized silane of the general formula $CH_2$=$CH$—$R$—$SiR'_u(R'')_3$—, wherein R, R' and R'' have the same meaning as indicated above, is added as further monomer to the mixture of compounds derived from step a). This alkenyl functionalized silane can be added in stoichiometric, substoichiometric or superstochiometric amounts. As already mentioned, the methods for this kind of copolymerisation are known to those skilled in the art. Insofar, in step b1), primarily a mixture of compounds comprising the coupling products of the alkenyl functionalized silane with the products to arrive from step a) are obtained.

Moreover, it is preferred if in step c) a primary and/or secondary aliphatic alcohol with 4 to 8 carbon atoms or mixtures thereof is used as solvent. It has been shown that positive effects can be achieved, if additionally at least one aprotic solvent with a high boiling point is used. By high boiling point, a temperature of at least 100° C. is understood. Preferably, the at least one aprotic solvent is selected from the group consisting of dimethylsulfoxide (DMSO), dimethylformamide (DMF), N-methylpyrrolidone (NMP), propylene carbonate, dioxane, 2-methylethylether (diglyme), hexamethylphosphoramide, sulfolane or mixtures thereof.

In addition, it is preferred if in step c) a moderator, selected from the group consisting of amino bases with primary and/or secondary amino functionalities is used. The moderator is preferably selected from a mono-, bi- or tridentate amine, which in addition to that can also possess a silyl functionality. In a special embodiment, the moderator comprises at least one aminosilane, in particular selected from the group consisting of 3-aminopropyl trimethoxysilane, 11-aminoundecyl triethoxysilane, m- and/or p-aminophenyl trimethoxysilane, 3-(aminophenoxy)propyl trimethoxysilane, 3-aminopropylmethyl diethoxysilane, 3-aminopropyldimethyl ethoxysilane, 3-aminopropyldiisopropyl ethoxysilane, N-(2-aminoethyl)-3-aminopropyl trimethoxysilane, N-(2-aminoethyl)-3-aminopropylmethyl dimethoxysilane, N-(2-aminoethyl)-3-amino-isobutylmethyl dimethoxysilane, N-(2-aminoethyl)-11-aminoundecyl trimethoxysilane, N-(2-aminoethyl)-3-aminoisobutyldimethyl methoxysilane, N-(2-amino-ethyl)-3-aminopropyl silanetriol, N-(6-aminohexyl)-3-aminomethyl trimethoxysilane, N-(6-aminohexyl)-3-aminopropyl trimethoxysilane, 3-aminopropylsilan-etriol. Above all, 3-aminopropyl triethoxysilane, 4-aminobutyl triethoxysilane and N-(2-aminoethyl)-3-aminopropyl triethoxysilane are preferred. The reagents of choice are 3-aminopropyl triethoxysilane, 4-aminobutyl triethoxysilane and N-(2-aminoethyl)-3-aminopropyl triethoxysilane.

Generally, the temperatures at which the method is carried out is not limited to a special range, yet it is preferred if the temperature in step b) is adjusted between −40 and +30° C., preferably between −20 and +5° C.

In a further preferred embodiment, a organo silicon component is added in step b). Preferably this component is of the general formula $R'_x Si(R'')_{4-x}$, wherein R' and R'' have the same meaning as indicated above and x=0, 1, 2, 3, 4. Again, the added silicon component can be added in either substoichiometric, stochiometric or superstoichiometric ratios. These organosilicon compounds may act as graftable compounds and adhesion promotors.

Optionally, further functional sol-gel-processable organosilicon compounds as cross-linkers and network modifiers can be added.

The mentioned organosilicon compounds serve to
improve the adhesion on transparent conducting oxides or other oxidic substrates,
cross-link by poly-condensation reactions the ingredients of the material,
act as network modifiers.

They comprise organo(alkoxy)silanes, organo(alkoxy)silane pre-hydrolysates, organosilanols and organopolysiloxane pre-condensates. The sol-gel process may be performed prior to or simultaneous with the in-situ polymerisation.

The special advantage of the method according to the invention is, that the chemical oxidative polymerisation as claimed in step c) can be carried out in situ. Preferably, the polymerisation is performed by adding at least one oxidant selected from the group consisting of iron-(III)-salts, hydrogenperoxide, dichromates, peroxodisulfates, perchlorates, persulfates, perborates, permanganates and/or mixtures thereof. Among the iron-(III)-salts, the following compounds are especially preferred: iron-(III)-chloride, iron-(III)-sulfate, iron-(III)-perchlorate, iron-(III)-alkylsulfonates, iron-(III)-carboxylate, iron-(III)-dodecylsulfonate, iron-(III)-salts of aromatic sulfonic acids, e.g. iron-(III)-benzenesulfonate and/or mixtures thereof. Iron-(III)-p-toluene-sulphonate is the reagent of choice.

Moreover, it is of advantage that in step c) additionally at least one compound derived from step a) is added.

Additionally, also a colour modifier selected from the group consisting of arylhydrazones of dyes constituted by an aromatic and/or heteroaromatic unsaturated core, end-capped with either electrochemically or chemically polymerogenic units or alternatively with alkoxysilane chains can be added. This addition can be carried out in each of the steps a) to c). The colour modifier is capable of colour switching upon redox cycling and is apt to correct the blue colour of the neutral basic electrochromic system.

According to the invention, also an electrochromic coating is provided comprising the units according to the following general formulae IV and V

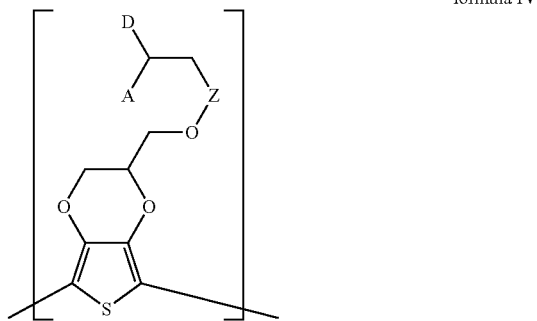

formula IV

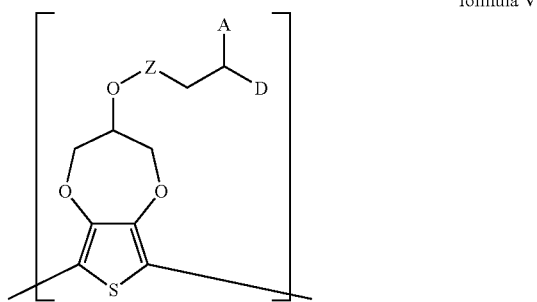

formula V wherein
Z is selected from the group consisting of the structural elements —R—, —C(O)—R— and —C(O)—NH—R—,
wherein
R is a linear and/or branched alkylene chain with 1 to 16 carbon atoms,
D is selected from the group consisting of —SiR'$_u$(R'')$_{3-u}$, —S—R—SiR'$_u$(R'')$_{3-u}$, and R has the same meaning as indicated above,
R' is selected from the group consisting of linear or branched alkyl or alkenyl chains with 1 to 12 carbon atoms in the main chain, wherein the chains can be substituted with acryloxy-, methacryloxy-, succinyl-, amino-, hydroxyl-, mercapto-, and/or glycidyloxy-groups and/or interrupted by O- and/or S-atoms and/or a NR-group, wherein R has the same meaning as indicated above,
R'' is selected from the group consisting of halogens, hydroxyl-groups, alkoxy-groups and/or acyl-groups with 1 to 4 carbon atoms, and
u=0, 1, 2, 3;
or alternatively represents a chemical bonding to corresponding positions D of neighboured monomers, of the formulae IV and/or V,
A is a linear and/or branched alkyl chain with 1 to 16 carbon atoms or hydrogen, and the compounds of the general formulae IV and V are comprised in a molar ratio of IV:V=m/(100−m), wherein m has a value in from 60 to 99.

In a preferred embodiment, m is selected from 70 to 95.

The material according to the invention shows a lot of advantages. One advantage is that the necessary time to induce a colour change upon oxidation or reduction is less than 3 seconds, preferably less than 2 seconds. These very short reaction times open a wide field of applications.

Furthermore, a material according to the invention shows high mechanical and/or photochemical stability and integrity.

Yet, another advantage of the coating according to the invention is that it possesses excellent adhesion behaviour towards glass, organic polymers or metal oxide surfaces, preferably transparent conducting oxides, especially preferred tin-doped indium oxide (ITO), fluorine-doped tin oxide (FTO), aluminium-doped zirconium oxide (AZO), antimony-doped tin oxide (ATO), antimony/tin-doped zinc oxide (ATZO) and indium/tin-doped zinc oxide (ITZO).

The coating according to the invention also shows a high contrast which can be more than 50% in the visible range of the electromagnetic spectrum at the wavelength of maximal absorption.

The thickness of this coating can be selected pending on the use the coating is intended for and is thus not limited. Preferably, the thickness of the coating is within the range of 10 nm to 1000 nm, preferably of 100 nm to 500 nm, especially preferred of 150 nm to 250 nm.

The coating according to the invention possesses increased chemical stability and resistance against decomposition. It was shown that the material according to the invention shows a decrease in absorption of less than 20%, preferably, less than 15% after 1000 redox cycles of electrochemical switching in liquid electrolyte under ambient conditions.

Preferably, the transmittance of the coating with a thickness of 200 nm in the visible range of the electromagnetic spectrum is above 80%.

Additionally, colour modifiers can be comprised within the coating. These colour modifiers are preferably selected from the group consisting of arylhydrazones of dyes constituted by an aromatic and/or heteroaromatic unsaturated core, end-capped with either electrochemically or chemically polymerogenic units or alternatively with alkoxysilane chains.

The coating can comprise additional compounds. For example, additionally an organo silicon compound of the general formula $R'_x Si(R'')_{4-x}$, is comprised, wherein R' and R" have the same meaning as mentioned above and x=0, 1, 2, 3, 4.

In another aspect of the invention, the coating according to the invention can be obtained by the method described above. Therefore, it is preferred, if compounds prepared according to steps a), b) or c) are used for the preparation of thin primer films in order to establish strong adhesion between the in-situ polymerized films resulting from step c) and the substrate they are applied to.

It is also according to the invention, that a use for the coating is given.

According to the invention, the coating can be used for coating a surface of a substrate, whereas the substrate is especially selected from the group consisting of glasses, plastics, metals, transparent conductors and metal oxides. Optionally the substrates can be coated with thin layers of conducting oxides (e.g. IZO, FTO, etc.) and/or conducting polymers (e.g. Poly-(3,4-ethylendioxythiophene)) which can be obtained starting from products such as Baytron P (by H. C. Starck).

The surface of the substrate is not limited to a special shape, i.e. the surface of the substrate can be flat or have a curvature (e.g. being convex or concave).

Preferably, the coating material can be applied to a substrate by administering compounds prepared according to Steps (a), (b) or (c) by preparation of thin primer films in order to establish strong adhesion between the in-situ polymerized films resulting from Step (c) and the substrate.

Preferably, the coating is applied to the substrate by means of spin coating, doctor blade coating, spray coating and/or roll-to-roll coating.

In addition to that, it has been shown to be positive if after application the coating is cured.

The curing of the coating can be accomplished by applying a radiation of any region of the electromagnetic spectrum including IR- to UV-radiation, heating to temperatures above 60° C., via curing by electron-beam and/or via curing by plasma.

It is preferred, if after curing the coating is rinsed. The rinsing agent is not limited to any substance but is preferably selected from the group consisting of a primary and/or secondary aliphatic alcohol with 4 to 8 carbon atoms, dimethylsulfoxide (DMSO), dimethylformamide (DMF), N-methylpyrrolidone (NMP), propylene carbonate, dioxane, 2-methylethyl-ether (diglyme), hexamethylphosphoramide, sulfolane and/or mixtures thereof. After rinsing, the coating can be dried.

A preferred use for the coatings is for electrochromic devices.

The coating also can be used for antistatic and/or electrodissipative equipment of surfaces, which can belong to plastic parts, textiles and/or fabrics.

In yet another embodiment, the coating can be used for corrosion protection of metal surfaces.

Also the use of the coating according to the invention for optical lenses, glasses and/or ophthalmic applications is preferred.

The present invention is further illustrated in detail by the following examples and figures. Yet the invention is not limited by the hereinafter mentioned special embodiments.

The figures show:

FIG. 1 shows the functionalisation of the pristine polymerogenic units to improve adhesion by sol-gel type processes.

Figure 2:
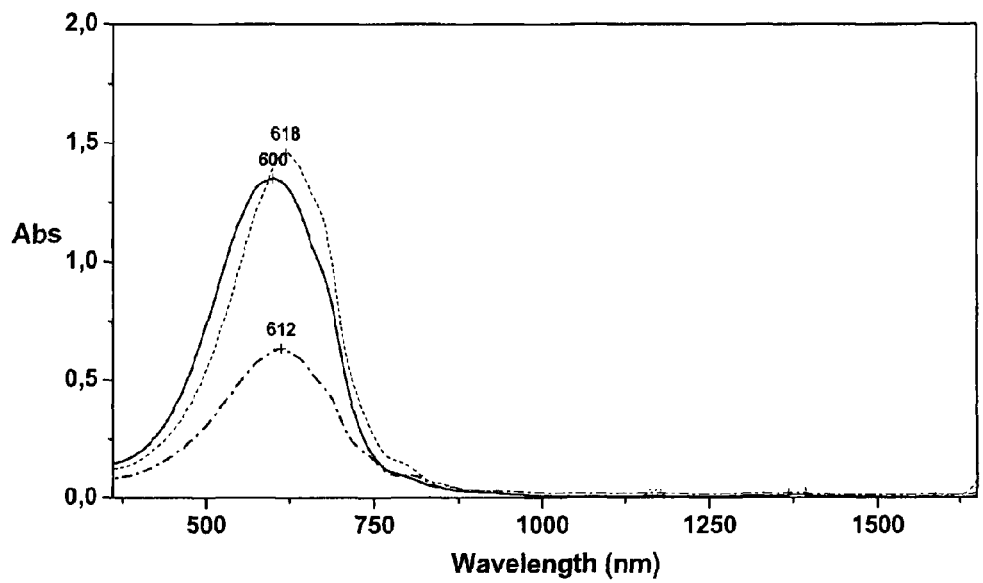
Figure 2:
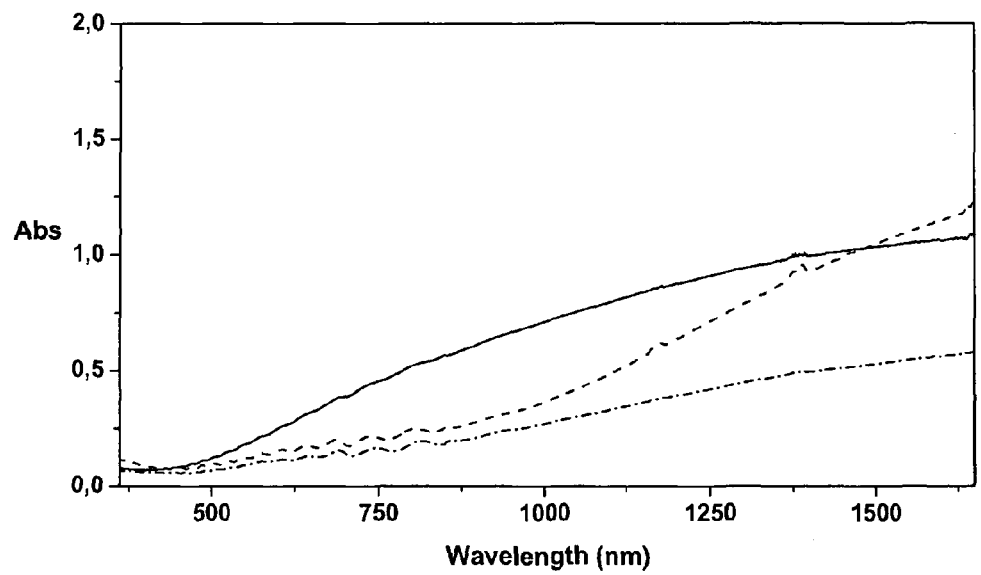
Figure 3:
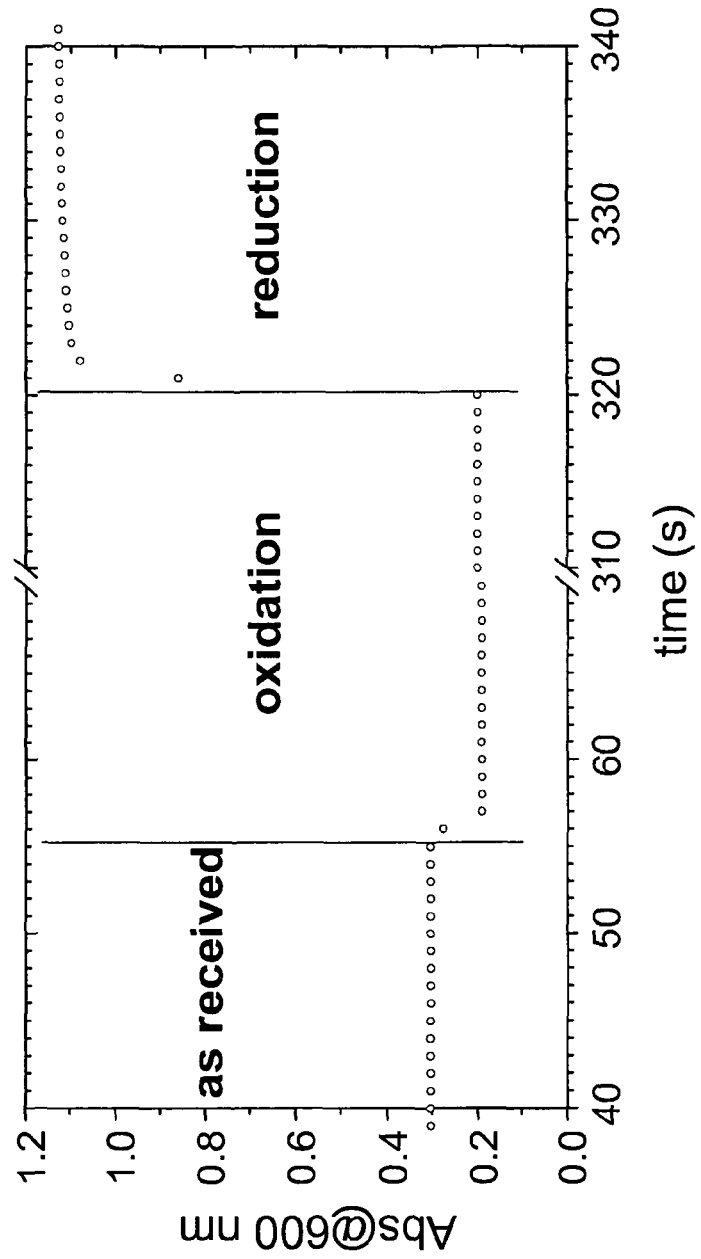

FIG. 2 shows the comparison of the effect of the length of the alkyl chain on the transparency in reduced and oxidised state of PolyEDOT-MeOH(——) vs. Poly SE-EC5 (- - - - -) vs. Poly SE-EC11 (-•-), FIG. 3 shows the standard system switching time between the oxidised/reduced states.

Figure 4:
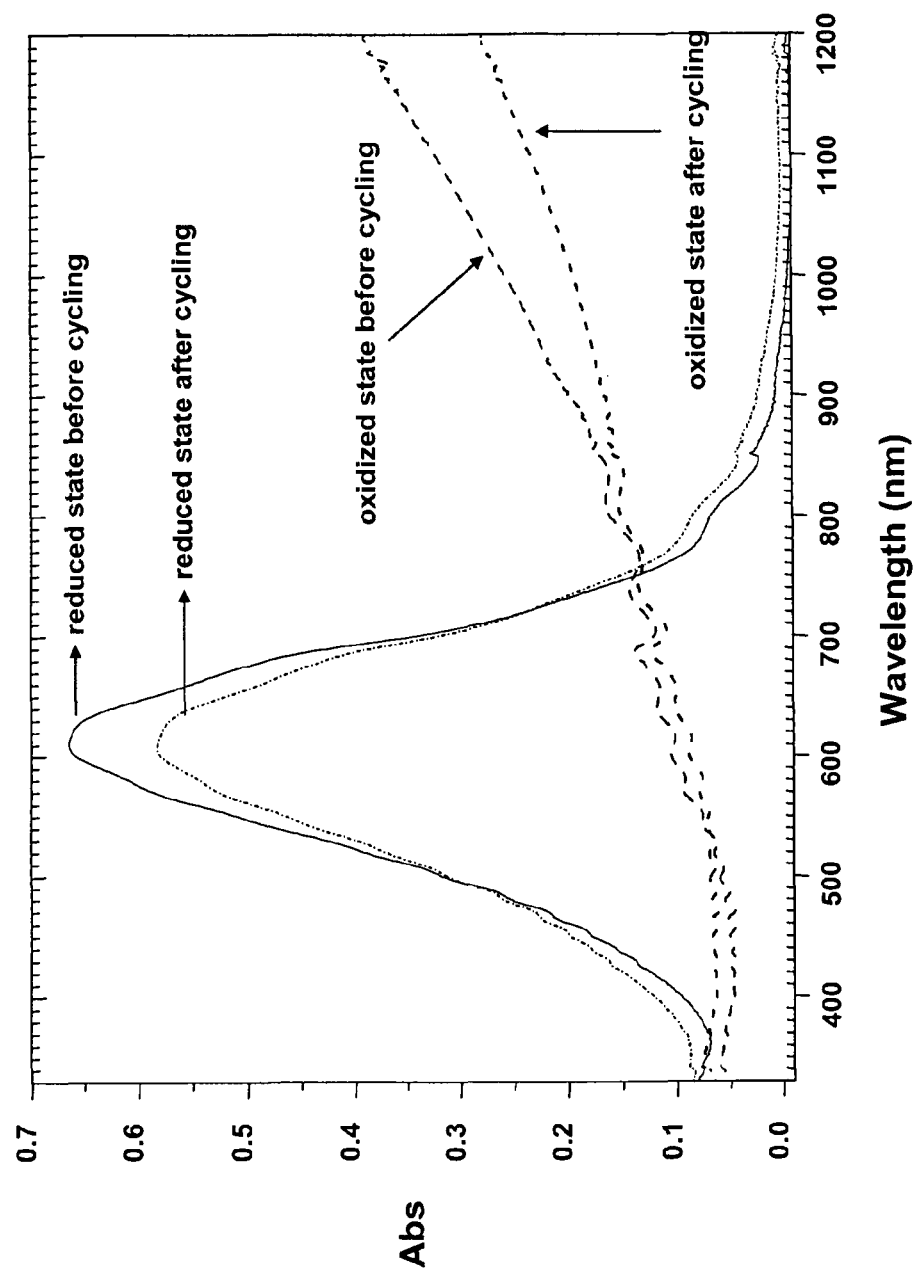

FIG. 4 shows the typical stability of an SE-EC11 coating after 1000 redox cycles of electrochemical switching in a liquid electrolyte (10 s at ±1.0 V).

SYNTHETIC PROCEDURES

Details on the Monomer System

The polymerogenic units were obtained starting from hydroxyfunctional 3,4-ethylenedioxythiophene derivatives, preferably, but not exclusively as the mixture described by Bayer (U. Merker, K. Reuter, K. Lerch (Bayer Chemical Corp.), US 2004/0085711 A1, 2004). The constituents of the original mixture (hereinafter abbreviated by SE) were 2-hydroxymethyl-2,3-dihydrothiene[3,4-b][1,4]dioxine (usually named (2-hydroxymethyl)-3,4-ethylenedioxythiophene or hydroxymethyl EDOT or else EDOT-MeOH) (80%) and 3,4-dihydro-3-hydroxy-2H-thieno[3,4-b][1,4]dioxepine (usually named 3-hydroxy-3,4-propylenedioxythiophene or hydroxy ProDOT) (20%). Optimisation of the process for the synthesis of this mixture may change the ratio of the 2 constituents from 70:30 to 95:5. In some of the further derivatised systems, the hydroxy ProDOT may even disappear after the purification of the raw mixture because of its greater solubility. Both hydroxy groups of the dioxine and of the dioxepine are almost readily reactive, the former more than the latter being a primary alcohol.

Carbamates are easily prepared by reacting the hydroxymethyl EDOT/hydroxy ProDOT mixture with the appropriate isocyanate in anhydrous toluene. Reflux is needed for a long time (80-120 hrs) depending on the chain length and further functionalisation of the isocyanate.

Esters are analogously obtained from the starting mixture of alcohols and the proper acyl chloride in the presence of 4-dimethylaminopyridine in anhydrous acetonitrile. Reflux is usually needed (4-6 hrs).

Ethers are obtained by reacting alkyl- or alkylene halides with alkaline alkoxides of the hydroxymethyl EDOT/hydroxy ProDOT mixture in turn prepared by reacting the hydroxy derivatives with the proper metal hydride in anhydrous acetonitrile. Reflux is needed to complete the reaction.

Very often purification is performed by dry flash chromatography. All final products have been characterised by UV-Vis, IR, $^1$H and $^{13}$C NMR and elemental analysis.

Details on Film Formation

The in-situ chemical oxidative polymerisation is performed at low temperatures to prepare electrochromic polymer films on transparent conductive substrates. Principally, the formulation of the coating sols is as follows. First a moderator base (any nitrogen base containing primary or secondary amino functions, also silylated species such as aminoalkyl alkoxy silanes) is dissolved in an appropriate organic solvent (n-butanol, ethanol, 2-propanol). Second, silyl functional monomer [from (b)] is added to the mixture. Optionally, non-silylated monomers prepared according to step a) may be added in order to obtain co-polymers. The mixture is then cooled in a thermostat. Third, the chosen organosilicon compound(s) and an oxidant are subsequently added to the mixture (in this order). Within a time window of 20 min after the addition of the oxidant, the coating solution is applied to the substrate and spun-off by means of a spin-coater. After thermal or IR treatment (optionally light curing when light-curable organosilicon compounds are employed), the polymer films are rinsed in an appropriate organic solvent to remove the overamount of oxidant and dried.

Electrochromic hybrid polymer materials result that are superior to state-of-the-art materials in terms of their bleached state transparency, electrochromic contrast, flexibility, durability and adhesion performance.

Surprising Observations and Unique Characteristics

It was surprisingly found that some of the monomers generated in Step (a), in particular those bearing long alkyl chains (>10 C-atoms) could not be electropolymerised whereas they underwent in-situ chemical polymerisation to afford homogeneous, thin films with an extraordinary transparency still maintaining a quite good electrochromic contrast and high cycling stability. This unique characteristic was attributed to the effect of substituent side chains that, when too long, create hindrance to order in the growing conductive chain.

Another remarkably positive feature of the present invention was the time necessary to induce the colour change upon oxidation and reduction, which was in the range of 1-2 seconds.

Another remarkable feature of the present invention is the mechanical integrity and higher stability of the films during potential cycling, being superior to that of the corresponding, purely organic films.

Moreover, it was surprisingly found that by the presence of bi- or tridentate amines such as triethylene diamine or 2-aminoethyl(3-aminopropyl)triethoxysilane the polymerisation rate of the thiophene monomers can be slowed down due to the strong reduction of the oxidizing power of the oxidant (possibly by forming chelate complexes), thus enabling proper control of the process which is of outmost importance for attaining coatings on large sized substrates with high optical quality and uniform thickness.

Generally speaking, the polymerisation process should be performed at very low temperatures (preferably at −17° C. or lower). However, by the use of amines capable of forming chelate bonds as moderator bases (e.g. silanes derived from ethylene diamine or triamine), it becomes possible to work at temperatures around 0° C., or even higher, which is considered to be another benefit of the invention.

EXAMPLES

Preparation was performed at the reflux temperature of the chosen solvent (anhydrous toluene for the carbamates, dry dichloromethane for the esters and anhydrous acetonitrile for the ethers).

To obtain the allyl carbamate derivative, equimolar amounts of allyl isocyanate (5% in excess) was added to the solution of SE, then the mixture was heated at reflux for 80 hours. After the evaporation of the solvent the product was purified by dry flash chromatography.

To obtain the undecanoyl ester derivative, equimolar amounts of 4-dimethylaminopyridine and of the undecanoyl chloride were dropwise added to the solution of SE, and then the solution was heated at reflux for 4 hours, cooled and poured into diethyl ether and filtered to eliminate the pyridinium salt. The solvent was then evaporated under reduced pressure and the pure product was obtained by dry flash chromatography.

To obtain the allyl ether derivative, a solution of SE was dropwise added and under nitrogen atmosphere to a suspension of sodium hydride, the mixture was stirred for 3 hours at room temperature to obtain the alkoxy anions. Then allyl bromide was added to the suspension and the mixture heated at reflux till completion of the reaction. The suspension was then diluted with dichloromethane, filtered to eliminate the inorganic salt to give a solution that was evaporated under reduced pressure.

Step (a)

Synthesis of SE-EC11 (the SE Undecenoyl Ester)

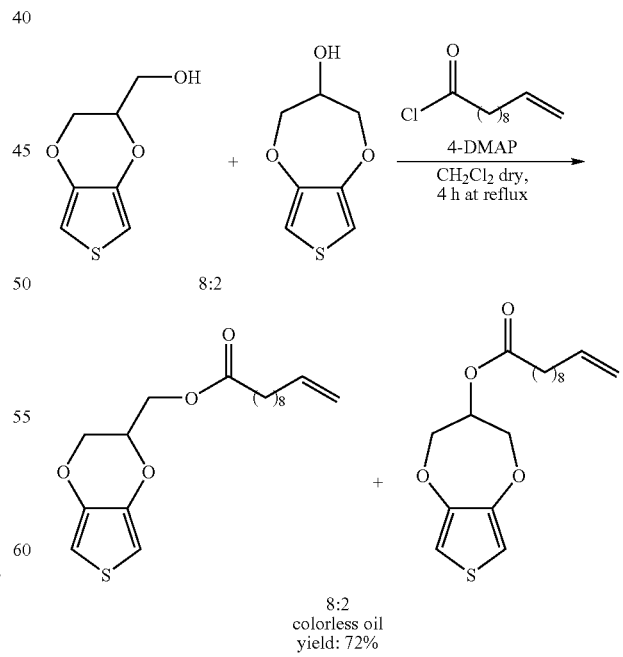

10-Undecenoyl chloride (5.9 g, 29 mmol) in dry dichloromethane was slowly added to a solution of 5 g (29 mmol) of SE dissolved in 40 ml of the same solvent containing 4-dimethylamino-pyridine (3.5 g, 29 mmol). The mixture was heated at reflux for 4 h, cooled, then poured into diethyl ether and filtered to eliminate the pyridinium salt. The solvent was then evaporated under reduced pressure to obtain a yellow oil. The pure product was obtained by dry flash chromatography ($SiO_2$—$CH_2Cl_2$/Hexane 4:1). Yield 72%. The product was characterised by $^1$H-NMR, UV-Vis and IR spectroscopy.

$^1$H-NMR δ ($CDCl_3$): 6.50 (s, 2H), 6.39-6.33 (m, 8H), 5.86-5.76 (m, 5H), 5.24 (quint, J=4.32 Hz, 1H), 4.97 (d, J=17.10 Hz, 5H), 4.93 (d, J=10.11 Hz, 5H), 4.41-4.18 (m, 20H), 4.07-4.00 (m, 4H), 2.41-2.33 (m, 10H), 2.08-2.00 (m, 10H), 1.70-1.59 (m, 10H), 1.44-1.22 (m, 50H).

UV-Vis (n-hexane): $\lambda_{max}$=236, 256 nm.

IR (% T): 3115.44 $cm^{-1}$ weak, 3074.94 $cm^{-1}$ weak, 2926.45 $cm^{-1}$ intense, 2854.13 $cm^{-1}$ intense, 1742.37 $cm^{-1}$ intense (C=O), 1640.16 $cm^{-1}$ weak, 1582.31 $cm^{-1}$ weak, 1484.92 $cm^{-1}$ intense, 1376.93 $cm^{-1}$ intense, 1185.04 $cm^{-1}$ intense, 1025.94 $cm^{-1}$ intense, 912.17 $cm^{-1}$ medium, 759.81 $cm^{-1}$ medium.

Synthesis of SE-CC3 (the SE Allyl Carbamate)

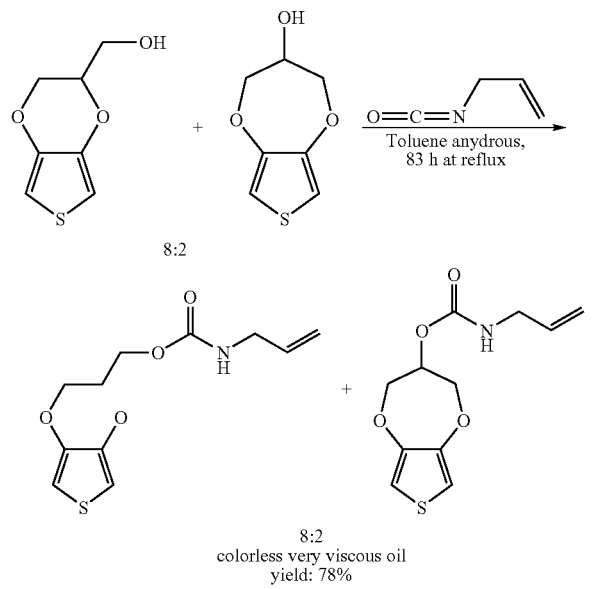

Allyl isocyanate (4.1 g, 48.8 mmol, 5% excess) was added to a solution of SE (8 g, 48.8 mmol) dissolved in 35 ml of anhydrous toluene. The mixture was heated at reflux for 46 h, then added of further allyl isocyanate (0.8 g, 9.2 mmol, reaching the 25% in excess) and heated again at reflux for 37 h, cooled, and the solvent was evaporated under reduced pressure. The product was purified by two dry flash chromatographies: the first ($SiO_2$—$CH_2Cl_2$/$Et_2O$ 7:3), the second ($SiO_2$—$CH_2Cl_2$/Hexane 8:1) to give a colourless very viscous oil. Yield 78%. The product was characterized by $^1$H-NMR, UV-Vis and IR spectroscopy.

$^1$H-NMR δ ($CDCl_3$): 6.50 (s 2H), 6.37-6.32 (m, 8H), 5.88-5.79 (m 5H), 5.20 (d J=17.28 Hz 5H), 5.14 (d, J=10, 48 Hz 5H), 5.10 (s 1H), 4.98 (s broad 4H), 4.81 (s broad 1H), 4.41-4.18 (m 20H), 4.07-3.98 (m, 4H), 3.86-3.77 (m, 10H).

UV-Vis (n-hexane): $\lambda_{max}$=236,256 nm.

IR (% T): 3341.07 $cm^{-1}$ intense (NH), 3112.55 $cm^{-1}$ medium, 2921.63 $cm^{-1}$ medium, 1711.51 $cm^{-1}$ intense (C=O), 1644.98 $cm^{-1}$ medium, 1526.38 $cm^{-1}$ intense, 1376.93 $cm^{-1}$ intense, 1247.72 $cm^{-1}$ intense, 1187.04 $cm^{-1}$ intense, 1024.02 $cm^{-1}$ intense, 920.84 $cm^{-1}$ intense, 763.67 $cm^{-1}$ intense.

Step (b)

In a flask 0.34 g (1 mmol) of the functional alkylenedioxythiophene monomer mixture SE-EC11 (consisting of approx. 80 mol % and 20 mol % of the hydroxymethyl EDOT and hydroxy ProDOT derivatives, respectively) and 0.20 g (1 mmol) 3-mercaptopropyl trimethoxysilane (MPTMO) were thoroughly mixed. In order to start the hydrolysis of MPTMO, 0.027 g of $H_2O$ (1.5 mmol) were slowly added to the mixture. After the hydrolysis was complete, the mixture was transferred into an aluminium vessel and irradiated by means of a UV curing device at a conveyor belt speed of 0.6 m/min (output power of 6.7 J/$cm^2$). The completion of the thiol-ene coupling reaction was checked by Raman spectroscopy. The reaction can alternatively be carried out without the addition of water.

Step (c)

A mixture of the non-alkoxysilyl functionalised monomer mixture SE-EC11 (1.28 g, 9 mmol) and 3-aminopropyl triethoxysilane (0.22 g, 1 mmol) was added to the above reaction product of step (b) and thoroughly mixed. In a second flask 2.5 mmol of a moderator base was dissolved in 3.71 g (50 mmol) of n-butanol. The moderator solution was stirred for 5 minutes before it was added to the monomer mixture. A solution of Fe(III)p-toluene sulphonate (9.97 g, 17.5 mmol) in n-butanol (79.8 g), pre-cooled in an ice-salt bad, was added to the above mixture and thoroughly stirred while the temperature was maintained below 0° C. After a 5 minutes mixing period, the flask was put in a thermostat and cooled to −17° C. The coating was performed by means of a spin-coater. The coating sol was applied to a substrate equipped with a transparent conductor [e.g. k-glass (Pilkington) or T-$MO_x$ PET-ITO foil (Baekert)] by means of a syringe or pipette. The sample was then spun subsequently at 600 rpm for 30 seconds and at 1200 rpm for 10 seconds. The coated samples were cured in an oven at 120° C. for 20 minutes. After curing, the films were rinsed in n-butanol or other appropriate solvents (or mixtures of solvents) in order to remove the overamount of Fe(III)p-toluene sulphonate. Finally, the films were dried with pressurised and ionised air.

The resulting electrochromic coatings typically have a coating thickness of 200 nm, show excellent adhesion on transparent conducting oxides (such as ITO) and a contrast >50% in the visible range of the electromagnetic spectrum. The switching times for darkening and bleaching are in the range of 1-2 seconds in liquid electrolytes (see FIG. 3).

The resulting electrochromic coatings typically show high stability upon voltage cycling: FIG. 4 shows the behaviour of the SE-EC11 coating after 1000 cycles.

If Step (c) is carried out using a moderator base able to form chelate complexes (such as triethylene diamine) the in-situ polymerisation can effectively be performed at room temperature. The resulting coating solution is suitably stable to attain homogeneous coatings by means of spin, knife (doctor blade), dip spray coating and roll-to-roll techniques.

The coatings according to the invention further exhibit the following special features:

Films contain silicon (some atom percent) besides carbon, sulphur, oxygen and traces of iron and nitrogen (detectable e.g. by energy dispersive X-ray spectroscopy and X-ray photoelectron spectroscopy).

Aliphatic C=C double bonds can be detected in the films (e.g. by IR or Raman spectroscopy), besides the typical absorption (IR) and emission (Raman) bands of ethylene dioxythiophenes.

The transparency of the films is above 80%, the electrochromic contrast above 50% at the wavelength of maximum absorption.

The films—when applied to clean ITO-surfaces—cannot be detached by immersion in boiling water.

The surfaces of the films may show characteristic circular structures (visible in scanning electron micrographs). These structures may result in a slight haze perceptible with the naked eye under low viewing angles (not perceptible at 90° viewing angle).

The invention claimed is:

1. Method for preparation of a electrochromic coating material comprising:
   a) reaction of a solution comprising a mixture of a compound having the general formula I and a compound having the general formula II in a molar ratio of I:II which is equal to m:(100−m) wherein m has a value from 60 to 99

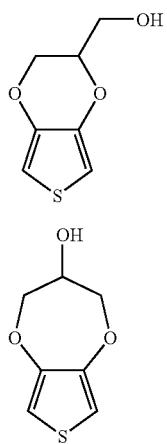

formula I formula II with a compound of the general formula III

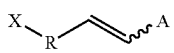

formula III wherein X is selected from the group consisting of Y—, Y—C(O)— or OCN— in which Y is selected from the groups of halides, mesylates and or triflates, R is a linear and/or branched alkylene chain with 1 to 16 carbon atoms, and A is a linear and/or branched alkyl chain with 1 to 16 carbon atoms or hydrogen
   b) further reacting the mixture of compounds derived from step a) by either
   b1) a vinyl copolymerisation
   b2) a hydrosilylation of the vinyl moiety with a silane of the general formula $HSiR'_u(R'')_{3-u}$, wherein
   R' is selected from the group consisting of linear or branched alkyl or alkenyl chains with 1 to 12 carbon atoms in the main-chain, wherein the chains can be substituted with acryloxy-, methacryloxy-, succinyl-, amino-, hydroxyl-, mercapto-, and/or glycidoxygroups and/or interrupted by O- and/or S-atoms and/or a NR-group,
   R'' is selected from the group consisting of halogens, hydroxyl-groups, alkoxy-groups and/or acyl groups with 1 to 4 carbon atoms, and u=0, 1, 2, 3; and further
   b3) a thiol-ene addition to the vinyl moiety with a compound of the general formula $HS—R—SiR'_u(R'')_{3-u}$,
   wherein R, R', R'' and u have the same meaning as indicated above;
   c) in-situ chemical oxidative polymerisation of a solution of the compound and/or the compounds derived from step b).

2. Method according to claim 1, wherein m has a value from 70 to 95.

3. Method according to claim 1, wherein in step a) a base selected from the group of aromatic and/or aliphatic nitrogen containing compounds is used in a stoichiometric or sub-stoichiometric ratio.

4. Method according to claim 3, wherein the base is selected from the group consisting of pyridine, 4-(dimethylamino)-pyridine, triethylamine and/or mixtures thereof.

5. Method according to claim 1, wherein in step a) a solvent, selected from the group consisting of acetonitrile, dichloromethane, toluene, 1,4-dioxane and mixtures thereof is used.

6. Method according to claim 5, wherein in step a) the reaction mixture is heated to reflux condition of the according solvent.

7. Method according to claim 1, wherein in step b1) the mixture of compounds derived from step a) is copolymerized.

8. Method according to claim 6, wherein before the copolymerisation of step b1) is undertaken further an alkenyl functionalized alkoxy silane of the general formula $CH_2=CH—R—SiR'_u(R'')_{3-u}$, wherein R, R' and R'' have the same meaning as indicated in claim 1, is added as further monomer to the mixture of compounds derived from step a).

9. Method according to claim 1, wherein in step c) a primary and/or secondary aliphatic alcohol with 4 to 8 carbon atoms or mixtures thereof is used as a solvent.

10. Method according to claim 9, further comprising at least one aprotic solvent with a high boiling point.

11. Method according to claim 10, wherein the at least one aprotic solvent is selected from the group consisting of dimethylsulfoxide (DMSO), dimethylformamide (DMF), N-methylpyrrolidone (NMP), propylene carbonate, dioxane, 2-methylethylether (diglyme), hexamethylphosphoramide, sulfolane or mixtures thereof.

12. Method according to claim 1, wherein in step c) a moderator, selected from the group consisting of amino bases with primary and/or secondary amino functionalities is used.

13. Method according to claim 12, wherein the moderator is a mono-, bi- or tridentate aliphatic and/or aromatic amine.

14. Method according to claim 12, wherein the moderator has a silyl-functionality.

15. Method according to claim 12, wherein the moderator comprises at least one aminosilane.

16. Method according to claim 15, wherein the aminosilane is selected from the group consisting of 3-aminopropyl trimethoxysilane, 3-aminopropyl triethoxysilane, 4-aminobutyl triethoxysilane, 11-aminoundecyl triethoxysilane, m- and/or p-aminophenyl trimethoxysilane, 3-(aminophenoxy)propyl trimethoxysilane, 3-aminopropylmethyl diethoxysilane, 3-aminopropyldimethyl ethoxysilane, 3-aminopropyldiisopropyl ethoxysilane, N-(2-aminoethyl)-3-aminopropyl trimethoxysilane, N-(2-aminoethyl)-3-aminopropyl triethoxysilane, N-(2-aminoethyl)-3-aminopropylmethyl dimethoxysilane, N-(2-aminoethyl)-3-aminoisobutylmethyl dimethoxysilane, N-(2-amino-ethyl)-11-aminoundecyl trimethoxysilane, N-(2-aminoethyl)-3-aminoisobutyldimethyl methoxysilane, N-(2-aminoethyl)-3-aminopropyl silanetriol, N-(6-aminohexyl)-3-aminomethyl trimethoxysilane, N-(6-aminohexyl)-3-aminopropyl trimethoxysilane, 3-aminopropyl silanetriol.

17. Method according to claim 1, wherein the temperature in step b) is adjusted between −40 and +30° C.

18. Method according to claim 1, wherein in step b) an organosilicon component is added.

19. Method according to claim 18, wherein the organosilicon component is of the general formula $R'_xSi(R'')_{4-x}$, wherein R' and R'' have the same meaning as indicated in claim 1 and x=0, 1, 2, 3, 4.

20. Method according to claim 1, wherein the in-situ chemical oxidative polymerisation is performed by adding at least one oxidant selected from the group consisting of iron-(III)-salts, hydrogenperoxide, dichromates, peroxodisulfates, perchlorates, persulfates, perborates, permanganates and/or mixtures thereof.

21. Method according to claim 20, wherein the iron-(III)-salts are selected from the group consisting of iron-(III)-chloride, iron-(III)-sulfate, iron-(III)-perchlorate, iron-(III)-alkylsulfonates, iron-(III)-carboxylates, iron-(III)-dodecylsulfonate, iron-(III)-salts of aromatic sulfonic acids, e.g. iron-(III)-benzenesulfonate, iron-(III)-p-toluenesulphonate and/or mixtures thereof.

22. Method according to claim 1, wherein in step c) a reaction temperature between −20° C. and +50° C.

23. Method according to claim 1, wherein in step c) at least one compound derived from step a) is added.

24. Method according to claim 1, wherein a colour modifier, selected from the group consisting of arylhydrazones of dyes constituted by an aromatic and/or heteroaromatic unsaturated core, end-capped with either an electrochemically or chemically polymerogenic units or alternatively with alkoxysilane chains is added.

25. Method according to claim 1, wherein the compounds prepared according to steps a), b) or c) are applied as thin primer films to a substrate.

26. Electrochromic coating comprising the units according to the following general formulae IV and V

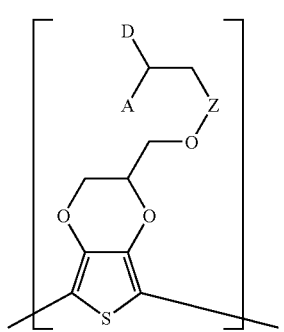

formula IV

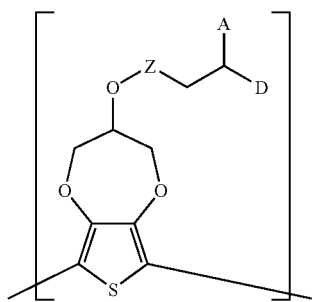

formula V wherein
Z is selected from the group consisting of the structural elements —R—, —C(O)—R— and —C(O)—NH—R—, wherein R is a linear and/or branched alkylene chain with 1 to 16 carbon atoms,
D is selected from the group consisting of —SiR′$_u$(R″)$_{3-u}$, —S—R—SiR′$_u$(R″)$_{3-u}$, and R has the same meaning as indicated above,
R′ is selected from the group consisting of linear or branched alkyl or alkenyl chains with 1 to 12 carbon atoms in the main chain, wherein the chains can be substituted with acryloxy-, methacryloxy-, succinyl-, amino-, hydroxyl-, mercapto-, and/or glycidyloxy-groups and/or interrupted by O- and/or S-atoms and/or a NR′-group, wherein R′ has the same meaning as indicated above,
R″ is selected from the group consisting of halogens, hydroxyl-groups, alkoxy-groups and/or acylgroups with 1 to 4 carbon atoms, and u=0, 1, 2, 3; or alternatively represents a chemical bonding to corresponding positions D of neighboured monomers of the formulae IV and/or V,
A is a linear and/or branched alkyl chain with 1 to 16 carbon atoms or hydrogen, and
the compounds of the general formulae IV and V are comprised in a molar ratio of IV:V=m/(100−m), wherein m has a value in from 60 to 99.

27. Coating according to claim 26, wherein m has a value of 70 to 95.

28. Coating according to claim 26, wherein the necessary time to induce a colour change upon oxidation or reduction is less than 3 seconds.

29. Coating according to claim 26, wherein the coating shows high mechanical stability and integrity.

30. Coating according to claim 26, wherein the coating possesses excellent adhesion behaviour towards glass, organic polymers or metal oxide surfaces, preferably transparent conducting oxides, especially preferred tin-doped indium oxide (ITO), fluorine-doped tin oxide (FTO), aluminium-doped zirconium oxide (AZO), antimony-doped tin oxide (ATO), antimony/tin-doped zinc oxide (ATZO) and indium/tin-doped zinc oxide (ITZO).

31. Coating according to claim 26, wherein the coating shows a contrast of more than 50% at the wavelength of maximum absorption in the visible range of the electromagnetic spectrum.

32. Coating according to claim 26, wherein the coating has a coating thickness of 10 nm to 1000 nm.

33. Coating according to claim 26, wherein the coating shows a decrease in absorption of less than 20% after 1000 redox cycles of electrochemical switching in liquid electrolyte under ambient conditions.

34. Coating according to claim 26, wherein the transmittance of the coating with a thickness of 200 nm in the visible range of the electromagnetic spectrum is above 80%.

35. Coating according to claim 26, further comprising colour modifiers.

36. Coating according to claim 35, wherein the colour modifiers are selected from the group consisting of arylhydrazones of dyes constituted by an aromatic and/or heteroaromatic unsaturated core, end-capped with either an electrochemically or chemically polymerogenic units or alternatively with alkoxysilane chains.

37. Coating according to claim 26, further comprising a organosilicon compound of the general formula R′$_x$Si(R″)$_{4-x}$, wherein
R′ is selected from the group consisting of linear or branched alkyl or alkenyl chains with 1 to 12 carbon atoms in the main chain, wherein the chains can be substituted with acryloxy-, methacryloxy-, succinyl-, amino-, hydroxyl-, mercapto-, and/or glycidyloxy-groups and/or interrupted by O- and/or S-atoms and/or a —NR′-group, wherein R′ has the same meaning as indicated above,
R″ is selected from the group consisting of halogens, hydroxyl-groups, alkoxy-groups and/or acylgroups with 1 to 4 carbon atoms, and u=0, 1, 2, 3; or alternatively represents a chemical bonding to corresponding positions D of neighboured monomers of the formulae IV and/or V,
and x=0, 1, 2, 3, 4.

38. Coating according to claim 26 obtainable by a method for preparation of a electrochromic coating material by subsequently performing following steps:
a) reaction of a solution comprising a mixture of a compound having the general formula I and a compound having the general formula II in a molar ratio of I:II which is equal to m:(100−m) wherein m has a value from 60 to 99

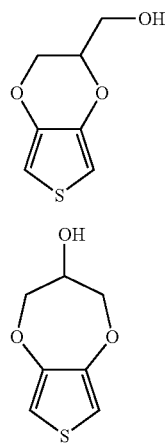

formula I formula II with a compound of the general formula III

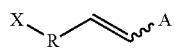

formula III wherein X is selected from the group consisting of Y—, Y—C(O)— or OCN— in which Y is selected from the groups of halides, mesylates and or triflates, R is a linear and/or branched alkylene chain with 1 to 16 carbon atoms, and A is a linear and/or branched alkyl chain with 1 to 16 carbon atoms or hydrogen
b) further reacting the mixture of compounds derived from step a) by either
b1) a vinyl copolymerisation
b2) a hydrosilylation of the vinyl moiety with a silane of the general formula HSiR'u(R")$_{3-u}$, wherein
R' is selected from the group consisting of linear or branched alkyl or alkenyl chains with 1 to 12 carbon atoms in the main-chain, wherein the chains can be substituted with acryloxy-, methacryloxy-, succinyl-, amino-, hydroxyl-, mercapto-, and/or glycidoxygroups and/or interrupted by O- and/or S— atoms and/or a NR-group,
R" is 5 selected from the group consisting of halogens, hydroxyl-groups, alkoxy groups and/or acyl groups with 1 to 4 carbon atoms, and
u=0, 1, 2, 3; and further
b3) a thiol-ene addition to the vinyl moiety with a compound of the general formula HS—R—SiR'$_u$(R")$_{3-u}$; wherein R, R', R" and u have the same meaning as indicated above;
c) in-situ chemical oxidative polymerisation of a solution of the compound and/or the compounds derived from step b).

39. Method of coating a surface of a substrate using a coating according to claim 26.

40. Method according to claim 39, wherein the surface of the substrate is flat or has a curvature.

41. Method according to claim 39, wherein the substrate is selected from the group consisting of glasses, plastics, metals, transparent conductors and metal oxides.

42. Method according to claim 39, wherein the coating is applied to the substrate by means of spin coating, doctor blade coating, dip coating, spray coating and/or roll-to-roll coating.

43. Method according to claim 39, wherein the coating is cured.

44. Method according to claim 43, wherein the curing is accomplished by applying a radiation of any region of the electromagnetic spectrum including IR- to UV-radiation, heating to temperatures above 60° C., via curing by electron-beam and/or via curing by plasma.

45. Method according to claim 43, wherein after curing the coating is rinsed with a rinsing agent.

46. Method according to claim 45, wherein the rinsing agent is selected from the group consisting of a primary and/or secondary aliphatic alcohol with 4 to 8 carbon atoms, dimethylsulfoxide (DMSO), dimethylformamide (DMF), N-methylpyrrolidone (NMP), propylene carbonate, dioxane, 2-methylethylether (diglyme), hexamethylphosphoramide, sulfolane and/or mixtures thereof.

47. Method according to claim 45, wherein after rinsing the coating is dried.

48. Method according to claim 39, wherein the surface is for electrochromic devices.

49. Method according to claim 39, wherein the surface is for antistatic and/or electrodissipative equipment of surfaces.

50. Method according to claim 39, wherein the substrate is selected from the group consisting of plastic parts, textiles and/or fabrics.

51. Method according to claim 39, wherein the surface is for corrosion protection of metal surfaces.

52. Method according to claim 39, wherein the surface is for optical lenses, glasses and/or ophthalmic applications.

53. Method according to claim 39, wherein the surface is for automotive and architectural glazings, greenhouses and other light protection applications.

* * * * *

UNITED STATES PATENT AND TRADEMARK OFFICE
CERTIFICATE OF CORRECTION

PATENT NO. : 8,592,003 B2
APPLICATION NO. : 12/517027
DATED : November 26, 2013
INVENTOR(S) : Cochet et al.

Page 1 of 1

It is certified that error appears in the above-identified patent and that said Letters Patent is hereby corrected as shown below:

Title page, item (73) Assignees:
"Fraunhofer-Gesellschaft zur forderung der angewandten Forschung e.V."
should read --Fraunhofer-Gesellschaft zur Förderung der angewandten Forschung e.V.--.

In the claims:
Claim 16, column 16, line 55, "N-(2-amino-ethyl)-11-aminoundecyl" should read --N-(2-aminoethyl)-11-aminoundecyl--.
Claim 38, column 19, line 52, "S- atoms" should read --S-atoms--.

Signed and Sealed this
Twentieth Day of May, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,592,003 B2  Page 1 of 1
APPLICATION NO. : 12/517027
DATED : November 26, 2013
INVENTOR(S) : Cochet et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1214 days.

Signed and Sealed this
Twenty-second Day of September, 2015

Michelle K. Lee
*Director of the United States Patent and Trademark Office*